US008436360B2

(12) United States Patent
Park et al.

(10) Patent No.: US 8,436,360 B2
(45) Date of Patent: May 7, 2013

(54) THIN FILM TRANSISTOR, METHOD OF FABRICATING THE SAME, AND ORGANIC LIGHTING EMITTING DIODE DISPLAY DEVICE INCLUDING THE SAME

(75) Inventors: Byoung-Keon Park, Yongin (KR); Jin-Wook Seo, Yongin (KR); Tae-Hoon Yang, Yongin (KR); Kil-Won Lee, Yongin (KR); Dong-Hyun Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/333,587

(22) Filed: Dec. 21, 2011

(65) Prior Publication Data

US 2012/0088340 A1 Apr. 12, 2012

Related U.S. Application Data

(62) Division of application No. 12/409,085, filed on Mar. 23, 2009, now Pat. No. 8,101,952.

(30) Foreign Application Priority Data

Mar. 27, 2008 (KR) .................. 10-2008-0028324

(51) Int. Cl.
*H01L 29/04* (2006.01)
(52) U.S. Cl.
USPC ............................................. 257/72; 257/59
(58) Field of Classification Search ............ 257/59, 257/72
See application file for complete search history.

(56) References Cited

U.S. PATENT DOCUMENTS

| 3,465,209 | A | 9/1969 | Denning et al. |
| 5,631,815 | A | 5/1997 | Cross |
| 5,637,515 | A | 6/1997 | Takemura |
| 6,087,206 | A | 7/2000 | Hamada |
| 6,191,449 | B1 | 2/2001 | Shino |
| 6,380,007 | B1 | 4/2002 | Koyama |
| 6,399,460 | B1 | 6/2002 | Yamaguchi et al. |
| 6,495,857 | B2 | 12/2002 | Yamazaki |

(Continued)

FOREIGN PATENT DOCUMENTS

| CN | 1388591 | 1/2003 |
| CN | 1638147 | 7/2005 |

(Continued)

OTHER PUBLICATIONS

Final Office Action of U.S. Appl. No. 12/194,739 dated Jul. 6, 2012.

(Continued)

*Primary Examiner* — Anthony Ho
(74) *Attorney, Agent, or Firm* — H.C. Park & Associates, PLC

(57) ABSTRACT

A thin film transistor, a method of fabricating the same, and an organic light emitting diode display device including the same. The thin film transistor includes: a substrate; a semiconductor layer disposed on the substrate, including a channel region, source/drain regions, and a body contact region; a gate insulating layer disposed on the semiconductor layer so as to expose the body contact region; a gate electrode disposed on the gate insulating layer, so as to contact the body contact region; an interlayer insulating layer disposed on the gate electrode; and source/drain electrodes disposed on the interlayer insulating layer and electrically connected to the source/drain regions. The body contact region is formed in an edge of the semiconductor layer.

8 Claims, 9 Drawing Sheets

U.S. PATENT DOCUMENTS

| | | |
|---|---|---|
| 6,500,704 B1 | 12/2002 | Hirano et al. |
| 6,506,669 B1 | 1/2003 | Kuramasu et al. |
| 6,531,815 B1 | 3/2003 | Okuyama et al. |
| 6,620,661 B2 | 9/2003 | Maekawa et al. |
| 6,746,905 B1 | 6/2004 | Fukuda |
| 6,893,503 B1 | 5/2005 | Ohnuma et al. |
| 7,045,444 B2 | 5/2006 | Yamazaki et al. |
| 7,098,089 B2 | 8/2006 | Paik |
| 7,130,002 B2 | 10/2006 | Seo et al. |
| 7,202,143 B1 | 4/2007 | Naseem et al. |
| 2001/0025992 A1 | 10/2001 | Nakajima et al. |
| 2001/0041397 A1 | 11/2001 | Fukushima |
| 2002/0013114 A1 | 1/2002 | Ohtani |
| 2002/0016029 A1 | 2/2002 | Kawakita et al. |
| 2002/0096681 A1 | 7/2002 | Yamazaki et al. |
| 2002/0182828 A1 | 12/2002 | Asami et al. |
| 2003/0013279 A1 | 1/2003 | Jang et al. |
| 2003/0030108 A1 | 2/2003 | Morosawa |
| 2003/0148561 A1 | 8/2003 | Nakajima |
| 2003/0155572 A1 | 8/2003 | Han et al. |
| 2003/0201442 A1 | 10/2003 | Makita |
| 2004/0046171 A1 | 3/2004 | Lee et al. |
| 2004/0089878 A1 | 5/2004 | Takehashi et al. |
| 2004/0135180 A1 | 7/2004 | Makita |
| 2004/0164300 A1 | 8/2004 | Yamazaki et al. |
| 2004/0206958 A1 | 10/2004 | Yamazaki et al. |
| 2005/0035352 A1 | 2/2005 | Onizuka |
| 2005/0105037 A1 | 5/2005 | Kim et al. |
| 2005/0110022 A1 | 5/2005 | Kim et al. |
| 2005/0133867 A1 | 6/2005 | Ohtani et al. |
| 2005/0140841 A1 | 6/2005 | Yang et al. |
| 2005/0170573 A1 | 8/2005 | Makita et al. |
| 2005/0285111 A1 | 12/2005 | Tsuboi |
| 2006/0033107 A1 | 2/2006 | Lee et al. |
| 2006/0040438 A1 | 2/2006 | Lu et al. |
| 2006/0115948 A1 | 6/2006 | Tokunaga |
| 2006/0263957 A1 | 11/2006 | Wong et al. |
| 2007/0007529 A1 | 1/2007 | Takemura et al. |
| 2007/0181890 A1 | 8/2007 | Yamazaki et al. |
| 2007/0207577 A1 | 9/2007 | Oyu |
| 2007/0228420 A1 | 10/2007 | Takano et al. |
| 2008/0001228 A1 | 1/2008 | Shionoiri et al. |
| 2008/0217620 A1 | 9/2008 | Park et al. |
| 2008/0246027 A1 | 10/2008 | Kim |
| 2009/0008642 A1 | 1/2009 | Kim et al. |

FOREIGN PATENT DOCUMENTS

| | | |
|---|---|---|
| EP | 0 816 903 | 1/1998 |
| EP | 0 225 821 | 6/1998 |
| EP | 1 052 700 | 11/2000 |
| EP | 1 508 921 | 2/2005 |
| EP | 1 524 702 | 4/2005 |
| EP | 1 858 068 | 11/2007 |
| EP | 2 003 695 | 12/2008 |
| EP | 2 009 680 | 12/2008 |
| EP | 2003695 | 12/2008 |
| EP | 2 028 687 | 2/2009 |
| EP | 2 107 613 | 10/2009 |
| JP | 62-104173 | 5/1987 |
| JP | 05-047791 | 2/1993 |
| JP | 06-151859 | 5/1994 |
| JP | 07-176753 | 7/1995 |
| JP | 07-326764 | 12/1995 |
| JP | 08-255907 | 10/1996 |
| JP | 10-012882 | 1/1998 |
| JP | 10-223533 | 8/1998 |
| JP | 10-242477 | 9/1998 |
| JP | 11-008393 | 1/1999 |
| JP | 11-111992 | 4/1999 |
| JP | 11-261075 | 9/1999 |
| JP | 2000-036598 | 2/2000 |
| JP | 2000-114527 | 4/2000 |
| JP | 2000-252474 | 9/2000 |
| JP | 2001-077364 | 3/2001 |
| JP | 2001-319878 | 11/2001 |
| JP | 2002-093745 | 3/2002 |
| JP | 2003-007719 | 1/2003 |
| JP | 2003-075870 | 3/2003 |
| JP | 2003-100633 | 4/2003 |
| JP | 2003-188098 | 7/2003 |
| JP | 2003-203924 | 7/2003 |
| JP | 2003-298059 | 10/2003 |
| JP | 2003-303831 | 10/2003 |
| JP | 2003-318194 | 11/2003 |
| JP | 2004-022845 | 1/2004 |
| JP | 2005-123565 | 5/2005 |
| JP | 2005-181973 | 7/2005 |
| JP | 2005-197526 | 7/2005 |
| JP | 2006-049823 | 2/2006 |
| JP | 2006-066860 | 3/2006 |
| JP | 2006-345003 | 12/2006 |
| JP | 2007-251149 | 9/2007 |
| KR | 10-1999-0075412 | 10/1999 |
| KR | 10-1999-0088504 | 12/1999 |
| KR | 10-2000-0052006 | 8/2000 |
| KR | 10-2003-0003043 | 1/2003 |
| KR | 10-2003-0057656 | 7/2003 |
| KR | 10-2003-0069779 | 8/2003 |
| KR | 10-2003-0073075 | 9/2003 |
| KR | 10-2003-0073076 | 9/2003 |
| KR | 10-2003-0084738 | 11/2003 |
| KR | 10-2004-0082168 | 9/2004 |
| KR | 10-2005-0036625 | 4/2005 |
| KR | 10-2005-0041836 | 5/2005 |
| KR | 10-2005-0049684 | 5/2005 |
| KR | 10-2005-0049692 | 5/2005 |
| KR | 10-509529 | 8/2005 |
| KR | 10-482462 | 9/2005 |
| KR | 10-2005-00106244 | 11/2005 |
| KR | 10-2006-0099694 | 9/2006 |
| KR | 10-2007-0024016 | 3/2007 |
| KR | 10-2008-0082827 | 9/2008 |

OTHER PUBLICATIONS

Notice of Allowance issued for related U.S. Appl. No. 12/405,466 dated Aug. 8, 2012.
U.S. Appl. No. 12/130,340, filed May 30, 2008.
Final Office Action of U.S. Appl. No. 12/194,739 dated Sep. 3, 2010.
U.S. Appl. No. 12/405,466, filed Mar. 17, 2009.
U.S. Appl. No. 12/194,739, filed Aug. 20, 2008.
U.S. Appl. No. 12/194,730, filed Aug. 20, 2008.
U.S. Appl. No. 12/502,413, filed Jul. 14, 2009.
European Search Report of EP Patent Application No. 08157167.1-2203 dated Nov. 28, 2008.
European Search Report of EP Patent Application No. 08162758.0-1528 dated Dec. 11, 2008.
Hu, Chen-Ming, et al. "Gettering of Nickel within Ni-Metal Induced Lateral Crystallization Polycrystalline Silicon Film through the Contact Holes", Japanese Journal of Applied Sciences, V.46, No. 48. 2007 pp. L1188-L1190.
Ng, K.K. "Complete Guide to Semiconductor Devices", 2nd Ed., Wiley Publishers (New York), 2002, pp. 694-695.
Myers, S.M., et al. "Mechanisms of Transition-metal Gettering in Silicon", Journal of Applied Physics, V.88, No. 7 (Oct. 1, 2000), pp. 3795-3819.
Benton, J.L., et al. "Behavior of Molybdenum in Silicon Evaluated for Integrated Circuit Processing", Journal of Electrochemical Society, V.146, No. 5, (1999), pp. 1929-1933.
Ishikawa, et al. "The Diffusion of Bismuth in Silicon", in Japanese Journal of Applied Physics, vol. 28, No. 7, pp. 1272-1273, published in 1989 (XP009121147).
European Office Action of EP Patent Application No. 08 157 16.1 dated Aug. 11, 2009.
Fariborz Assaderachi et al. "Dyunamic Threshhold-Voltage MOSFET (DTMOS) for Ultra-Low Voltage VLSI" IEEE Transactions on Electron Devices, IEEE Service Center, Piscataway, NJ US, vol. 44, No. 3, Mar. 1, 1997, XP011016082.
Chinese Office Action of CN Patent Application No. 200810214019 dated Aug. 28, 2009.
European Search Report of EP Patent Application No. 09156279 dated Sep. 2, 2009.

European Search Report of EP Patent Application No. 09157829 dated Sep. 4, 2009.
European Search Report of EP Patent Application No. 09165373.3 dated Nov. 3, 2009.
Non-Final Office Action of U.S. Appl. No. 12/194,739 dated Mar. 8, 2010.
Office Action of U.S. Appl. No. 12/130,340 dated Nov. 26, 2010.
Non-Final Office Action of U.S. Appl. No. 12/194,730 dated Dec. 9, 2010.
Non-Final Office Action of U.S. Appl. No. 12/194,739 dated Dec. 23, 2010.
Final Office Action of U.S. Appl. No. 12/194,730 dated May 4, 2011.
Final Office Action of U.S. Appl. No. 12/130,340 dated May 12, 2011.
Final Office Action of U.S. Appl. No. 12/194,739 dated Jun. 9, 2011.
Non-Final Office Action of U.S. Appl. No. 12/409,085 dated Jun. 24, 2011.
Jones et al. "Diffusivity of Impurities in Polysilicon", Feb. 21, 2007, XP009150765.
Non-Final Office Action of U.S. Appl. No. 12/502,413 dated Sep. 30, 2011.
Non-Final Office Action of U.S. Appl. No. 12/405,466 dated Sep. 21, 2011.
Non-Final Office Action of U.S. Appl. No. 12/130,340 dated Oct. 7, 2011.
Notice of Allowance of U.S. Appl. No. 12/194,730 dated Oct. 4, 2011.
Notice of Allowance of U.S. Appl. No. 12/409,085 dated Oct. 17, 2011.
Notice of Allowance issued for related U.S. Appl. No. 12/194,730 dated Jun. 12, 2012.
Non-Final Office Action of U.S. Appl. No. 12/194,739 dated on Jan. 20, 2012.
Final Office Action of U.S. Appl. No. 12/405,466 dated Apr. 5, 2012.
Korean Notice of Allowability issued on Dec. 26, 2008 in corresponding Korean Application No. 2007-84934.
Korean Notice of Allowability issued on Dec. 26, 2008 in corresponding Korean Application No. 2007-84412.
Notice of Allowability issued on Sep. 29, 2008 in corresponding Korean Patent Application No. 2007-53314.
Office Action issued by Korean Intellectual Property Office in Korean Patent Application No. 2007-53314 on Mar. 25, 2008.
Final Office Action of U.S. Appl. No. 12/502,413 dated, Feb. 16, 2012.
Final Office Action of U.S. Appl. No. 12/130,340 dated Mar. 8, 2012.
Notice of Allowance issued for related U.S. Appl. No. 12/194,739 dated Mar. 19, 2013.
Non-Final Office Action issued for related U.S. Appl. No. 13/464,579 dated Mar. 21, 2013.

THIN FILM TRANSISTOR, METHOD OF FABRICATING THE SAME, AND ORGANIC LIGHTING EMITTING DIODE DISPLAY DEVICE INCLUDING THE SAME

CROSS-REFERENCE TO RELATED APPLICATIONS

This application is a divisional of U.S. patent application Ser. No. 12/409,085, filed on Mar. 23, 2009 and claims the benefit of and priority from Korean Patent Application No. 10-2008-0028324, filed on Mar. 27, 2008 both of which are incorporated herein.

BACKGROUND OF THE INVENTION

1. Field of the Invention

Aspects of the present invention relate to a thin film transistor, a method of fabricating the same, and an organic light emitting diode display device including the same.

2. Description of the Related Art

In general, a polycrystalline silicon layer is widely used as a semiconductor layer is of a thin film transistor, because of its high field effect mobility and its applicability to a high-speed circuit and/or a complementary metal-oxide semiconductor (CMOS) circuit. A thin film transistor using such a polycrystalline silicon layer is used as a switching device of an active matrix liquid crystal display (AMLCD) device. Such a thin film transistor is also used as a switching device and/or a driving device of an active matrix organic light emitting diode display device (AMOLED).

The polycrystalline silicon thin film transistor used in the active matrix display devices is generally a floating body polycrystalline silicon thin film transistor (poly-Si TFT) having a floating, island-shaped semiconductor layer. As a floating body polycrystalline silicon thin film transistor is scaled down, it leads to a reduced drain current and a reduced saturation region thereof.

To solve this problem, a gate-body contact TFT, in which a semiconductor layer is connected with a gate electrode, has been proposed. The gate-body contact TFT has an enhanced sub-threshold slope value and a high drain current at a low gate voltage. Accordingly, an on/off characteristic can be achieved, even at such a low gate voltage, resulting in a low-power, flat panel display device.

Conventionally, a body contact region that contacts a gate electrode was separately formed, so as to extend from a conventional semiconductor layer having no body contact region, in order to implement a gate-body contact thin film transistor. However, this configuration increases an area occupied by a semiconductor layer and the body contact region, and is inappropriate for device integration.

SUMMARY OF THE INVENTION

Aspects of the present invention provide a thin film transistor having a smaller area than a conventional gate-body contact thin film transistor, by implementing a gate-body contact structure, without extending a separate body contact region from a semiconductor layer, by using an edge region of a semiconductor layer as a body contact region. Aspects of the present invention also relate to a method of fabricating the thin film transistor, and an organic light emitting diode display device including the same.

According to an exemplary embodiment of the present invention, a thin film transistor includes: a substrate; a semiconductor layer disposed on the substrate and including a channel region, source/drain regions, and a body contact region; a gate insulating layer disposed on the semiconductor layer and exposing the body contact region; a gate electrode disposed on the gate insulating layer, in contact with the body contact region; an interlayer insulating layer disposed on the gate electrode; and source/drain electrodes disposed on the interlayer insulating layer and electrically connected to the source/drain regions. The body contact region is disposed at an edge of the semiconductor layer.

According to another exemplary embodiment of the present invention, a method of fabricating a thin film transistor includes: forming a semiconductor layer on a substrate; forming a gate insulating layer on the semiconductor layer, which exposes an edge of the semiconductor layer; forming a gate electrode on the gate insulating layer, which contacts the exposed edge of the semiconductor layer; forming an interlayer insulating layer on the gate electrode; and forming source/drain electrodes on the interlayer insulating layer. The source/drain electrodes are electrically connected to source/drain regions of the semiconductor layer, through openings in the interlayer insulating layer and the gate insulating layer.

According to yet another exemplary embodiment of the present invention, an organic lighting emitting diode display device includes: a substrate; a semiconductor layer disposed on the substrate and including a channel region, source/drain regions, and a body contact region; a gate insulating layer disposed on the semiconductor layer and exposing the body contact region; a gate electrode disposed on the gate insulating layer, in contact with the body contact region; an interlayer insulating layer disposed on the gate electrode; source/drain electrodes disposed on the interlayer insulating layer and electrically connected to the source/drain regions; a first electrode electrically connected to one of the source/drain electrodes; an organic layer disposed on the first electrode and including an emission layer; and a second electrode disposed on the organic layer. The body contact region is disposed at an edge of the semiconductor layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

Figure 1A:
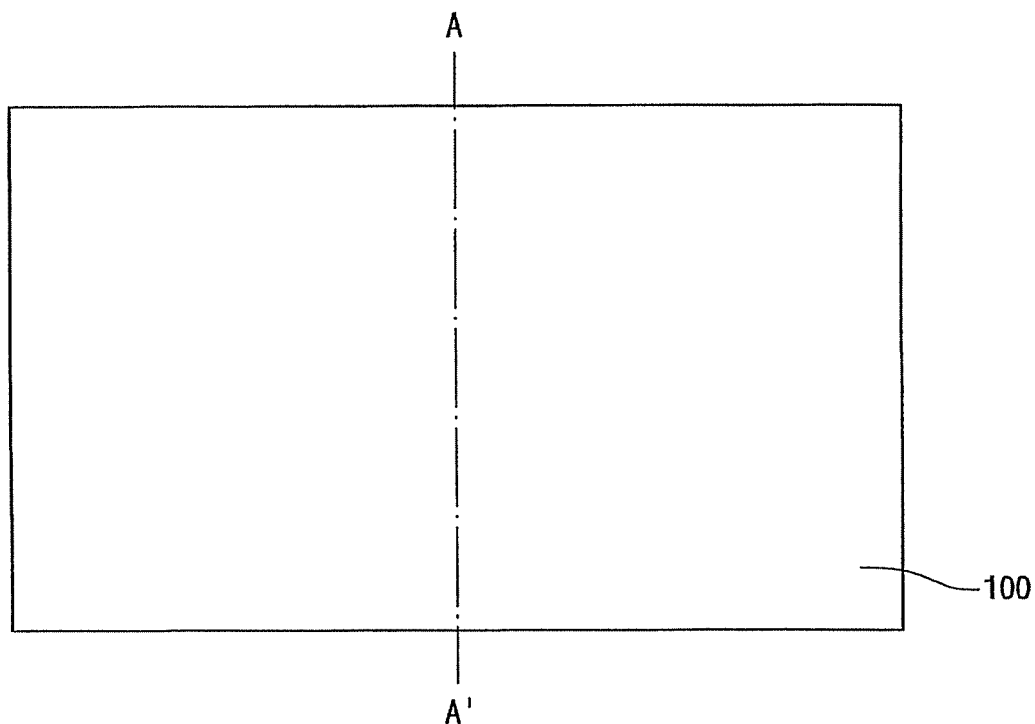
FIGS. 1A, 2A, 3A, 4A, and 5A are plan views illustrating a process of fabricating a thin film transistor, according to Exemplary Embodiment 1 of the present invention.

Reference will now be made in detail to the exemplary embodiments of the present invention, examples of which are shown in the accompanying drawings, wherein like reference numerals refer to the like elements throughout the specification. The exemplary embodiments are described below, in order to explain the aspects of the present invention, by referring to the figures.

As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated listed items.

Exemplary Embodiment 1

FIGS. 1A, 2A, 3A, 4A, and 5A are plan views illustrating a process of fabricating a thin film transistor, according to Exemplary Embodiment 1 of the present invention. FIGS. 1B, 2B, 3B, 4B, and 5B are cross-sectional views taken along line A-A' of FIGS. 1A, 2A, 3A, 4A, and 5A.

Figure 1B:
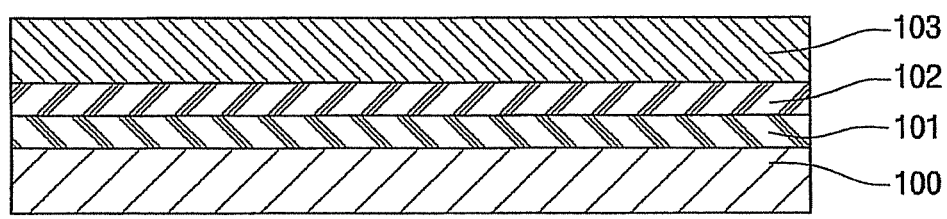
FIGS. 1B, 2B, 3B, 4B, and 5B are cross-sectional views taken along line A-A' of FIGS. 1A, 2A, 3A, 4A, and 5A, respectively.

Referring to FIGS. 1A and 1B, a buffer layer 101 is formed on a substrate 100, which can be formed of glass or plastic. The buffer layer 101 can include one or more insulating layers, such as a silicon oxide layer, or a silicon nitride layer. The insulating layers can be formed by chemical vapor deposition or physical vapor deposition, for example. The buffer layer 101 prevents the diffusion of moisture and/or impurities from the substrate 100. The buffer layer 101 can also be used to control the rate of heat transfer during the crystallization of an amorphous silicon layer.

A polycrystalline silicon layer 102 is then formed on the buffer layer 101. The polycrystalline silicon layer 102 may be formed by crystallizing an amorphous silicon layer, using a crystallization method, such as Rapid Thermal Annealing (RTA), Solid Phase Crystallization (SPC), Excimer Laser Crystallization (ELA), Metal Induced Crystallization (MIC), Metal Induced Lateral Crystallization (MILC), Sequential Lateral Solidification (SLS), or Super Grain Silicon (SGS).

An insulating layer 103 is then formed on the polycrystalline silicon layer 102. The insulating layer 103 may be a silicon oxide layer, a silicon nitride layer, or a combination thereof.

Figure 2A:
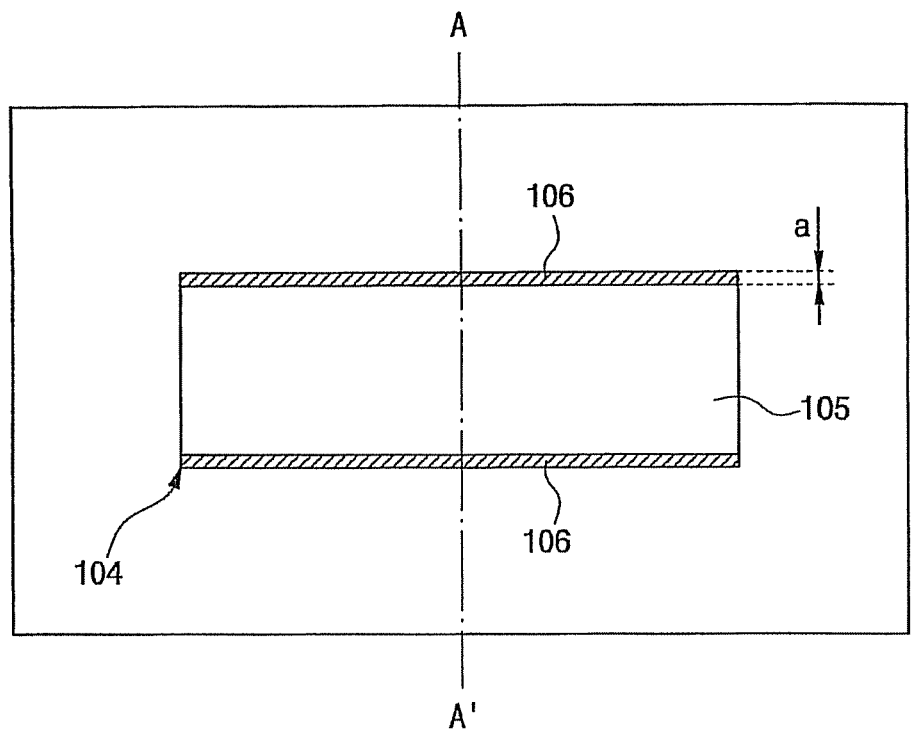
Figure 2B:
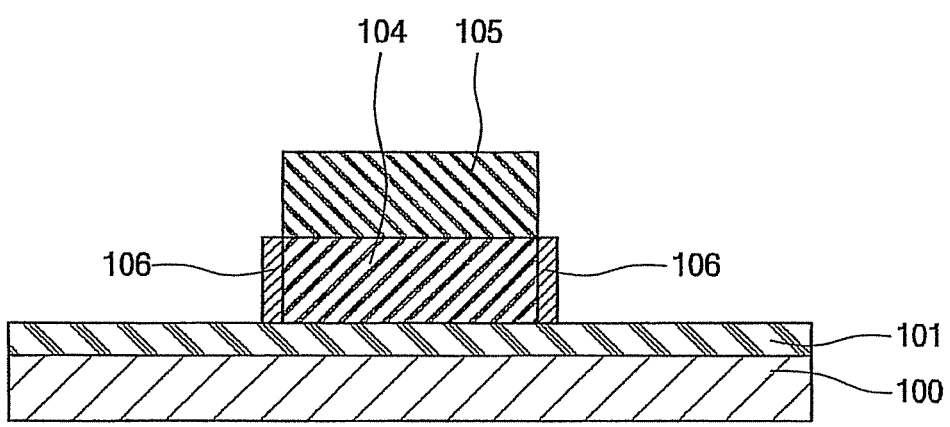

Referring to FIGS. 2A and 2B, the polycrystalline silicon layer 102 and the insulating layer 103 are patterned. The polycrystalline silicon layer 102 is patterned to form a semiconductor layer 104. The insulating layer 103 is patterned to form a gate insulating layer 105. The gate insulating layer 105 exposes one or more edge regions 106 of the semiconductor layer 104.

Herein, the length of the semiconductor layer 104 refers to a direction that is parallel to a line connecting a source region 107 (FIG. 3A) to a drain region 108 (FIG. 3A) of the semiconductor layer 104, and the width of the semiconductor layer 104 refers to a direction perpendicular to the length direction, i.e., extending along line A-A'. The edge regions 106 of the semiconductor layer 104 are separated by a predetermined distance, across the width of the semiconductor layer 104.

The gate insulating layer 105 may be formed to expose the edge region 106 of the semiconductor layer 104, by a one-time patterning process, i.e., by adjusting etching conditions so that the insulating layer 103 is over-etched relative to the polycrystalline silicon layer 102. For example, the gate insulating layer 105 may be etched to expose the edge region 106 of the semiconductor layer 104, by making a critical dimension (CD) bias of the insulating layer 103 greater than that of the underlying polycrystalline silicon layer 102.

The width a of the edge region 106 is less than about 0.1 .mu.m. This range forms a gate-body contact TFT structure without a separate extended body contact region, while not greatly reducing the area of a channel region of the existing semiconductor layer 104.

Figure 3A:
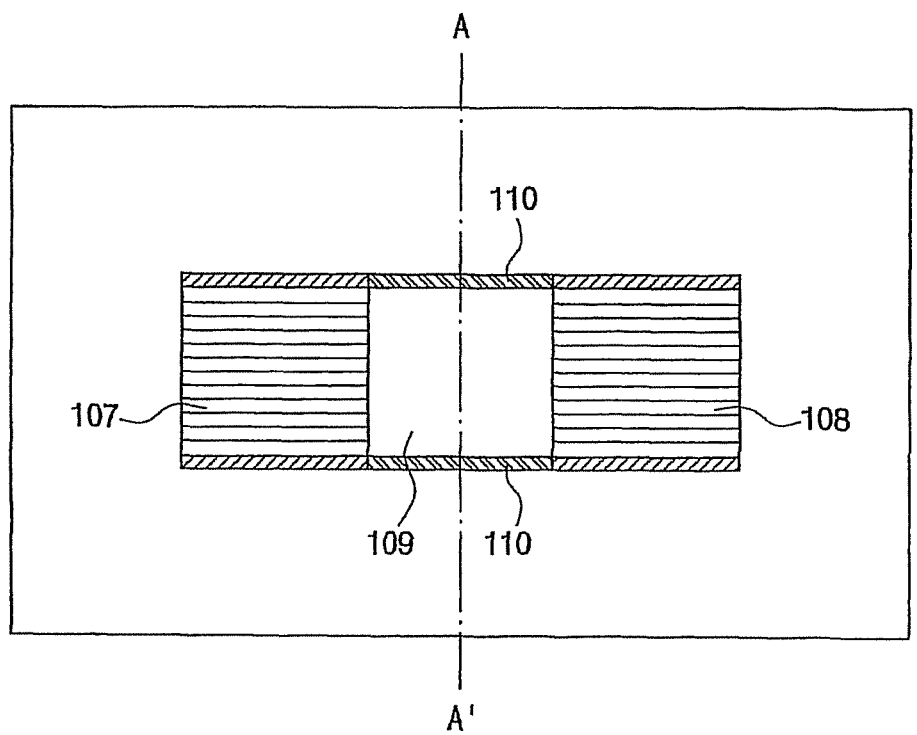
Figure 3B:
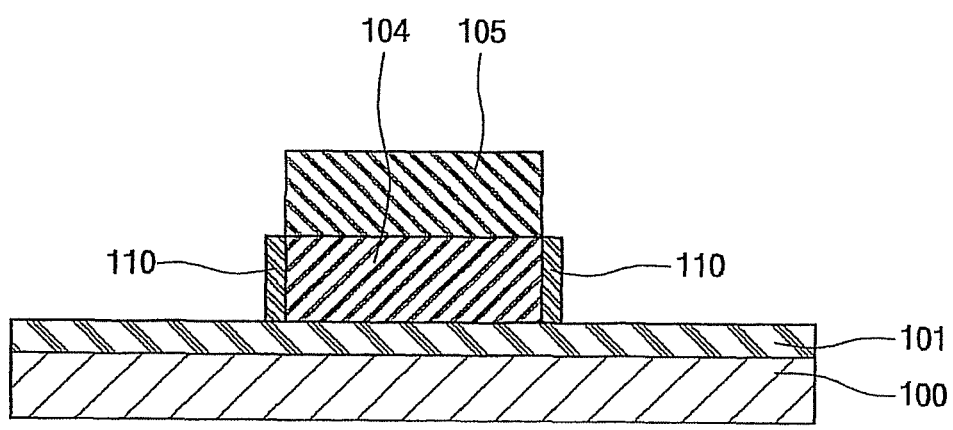

Referring to FIGS. 3A and 3B, an impurity is injected into the edge region 106 of the semiconductor layer 104, which is exposed through the gate insulating layer 105. A different type of impurity is injected into the source/drain regions 107 and 108 of the semiconductor layer 104. One of the impurities can be an N-type impurity, and the other impurity can be a P-type impurity, for example. This results in a PNP or NPN structure of the source/drain regions 107 and 108 of the semiconductor layer 104 and the edge region 106, such that current flowing from the source and/or drain regions 107 and 108 does not flow into the edge region 106. The P-type impurity can be selected from the group consisting of boron B, aluminum (Al), gallium (Ga), and indium (In). The N-type impurity can be selected from the group consisting of phosphorus (P), arsenic (As), and antimony (Sb).

The source/drain regions 107 and 108 of the semiconductor layer 104 are formed by injecting an impurity into regions in which the source/drain regions 107 and 108 of the semiconductor layer 104 are to be formed. A channel region 109 is formed between the source region 107 and the drain region 108. Body contact regions 110 are formed in edge regions 106 of the semiconductor layer 104 and extend between the source region 107 and the drain region 108. The body contact regions 110 are connected to, and are disposed at opposing sides of, the channel region 109. For convenience, only one of the body contact regions 110 will be referred to hereinafter.

The source/drain regions 107 and 108 may be formed by injecting the impurity into the semiconductor layer 104, using a photoresist pattern as a mask. Alternatively, the source/drain regions 107 and 108 may be formed by injecting the impurity into the semiconductor layer 104, using a subsequently formed gate electrode as a mask.

Figure 4A:
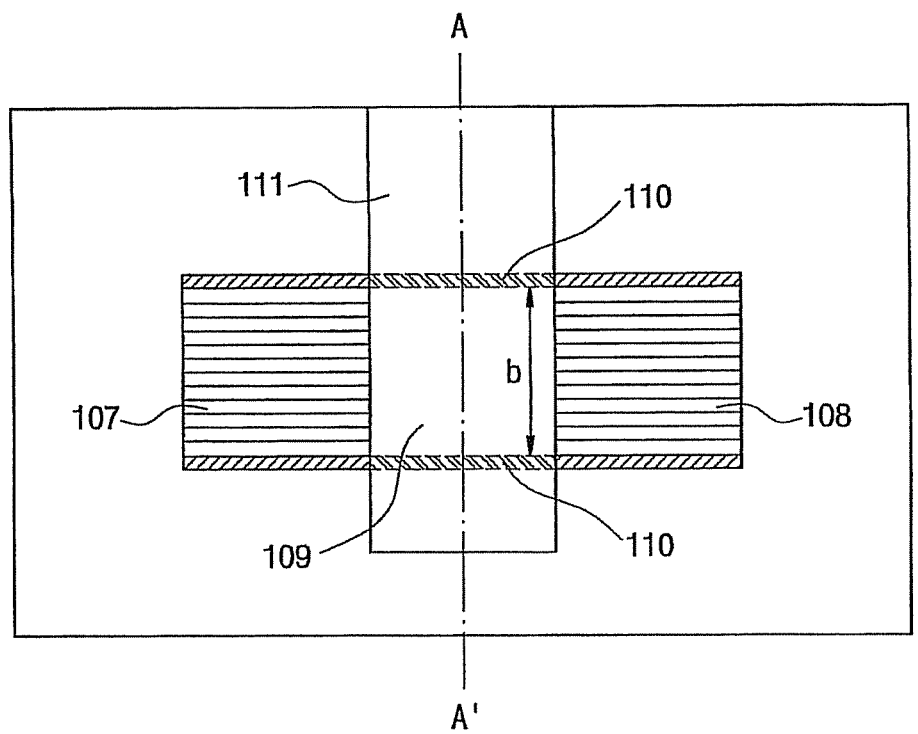
Figure 4B:
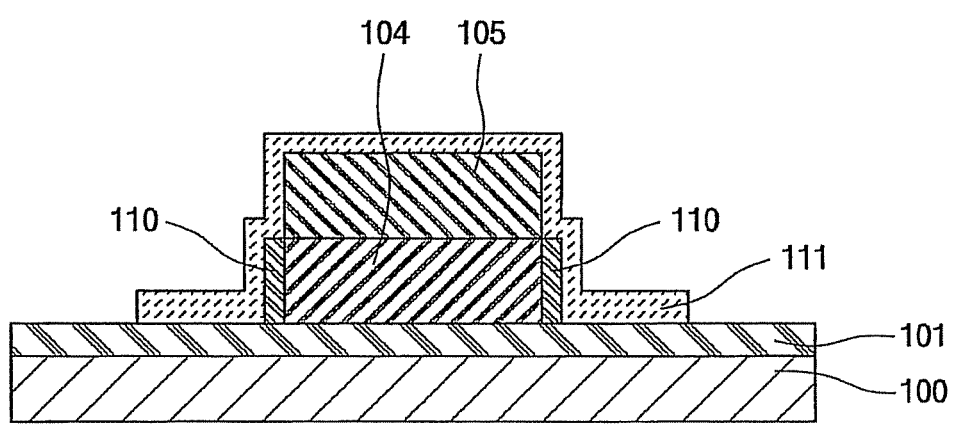

Referring to FIGS. 4A and 4B, a gate electrode material is deposited on the gate insulating layer 105 and is then patterned to form a gate electrode 111. The gate electrode 111 overlaps the channel region 109 and the body contact region 110. The gate electrode 111 may be a layer of aluminum (Al), a layer of an aluminum alloy such as aluminum-neodymium (Al—Nd), or multi-layers of an aluminum alloy stacked on a chromium (Cr) or molybdenum (Mo) alloy. Since the insulating layer 103 is patterned, so as to expose the body contact region 110, the gate electrode 111 contacts the body contact region 110, resulting in a gate-body contact TFT. As the body contact regions 110 are disposed at opposing edges of the channel region 109, the width b of the channel region 109 is smaller than the width of the semiconductor layer 104 as a whole, i.e., the channel region 109 plus the width of the body contact regions 110.

In the related art, a semiconductor layer is formed by forming a polycrystalline silicon layer on the entire surface of the substrate, forming a photoresist pattern on the polycrystalline silicon layer, and etching the polycrystalline silicon layer using the photoresist pattern as a mask. In etching the polycrystalline silicon layer, the edges of the semiconductor layer may be damaged by an etching solution or a plasma used for the etching.

In addition, the photoresist remaining on the edges of the semiconductor layer may make the semiconductor layer non-uniform and/or have poor characteristics. This may affect a threshold voltage, or an S-factor, of a TFT including such a semiconductor layer, and may cause a hump on an I-V characteristic curve of the TFT. These problems are caused by including the damaged edges in the channel region.

Aspects of the present invention can solve the above and/or other problems, by injecting an impurity into edges of a semiconductor layer that contact a channel region, instead of including the edges in the channel region. The impurities form body contact regions, which contact a gate electrode. This makes it possible to form a gate-body contact thin film transistor using an existing semiconductor layer, without forming a separate body contact region.

Figure 5A:
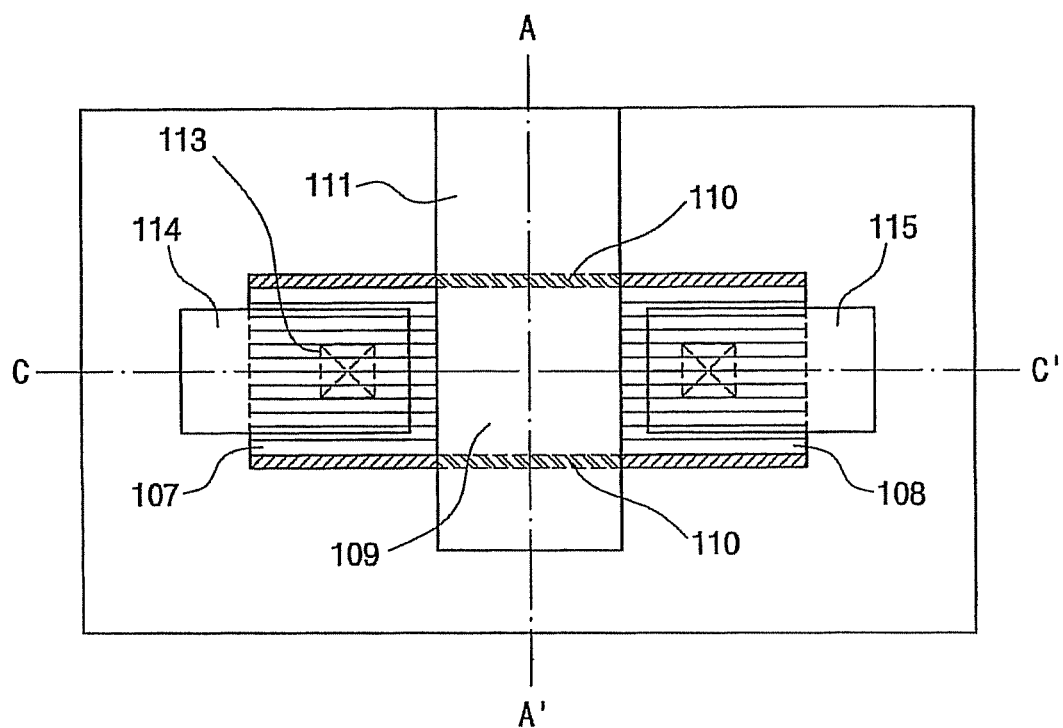
Figure 5B:
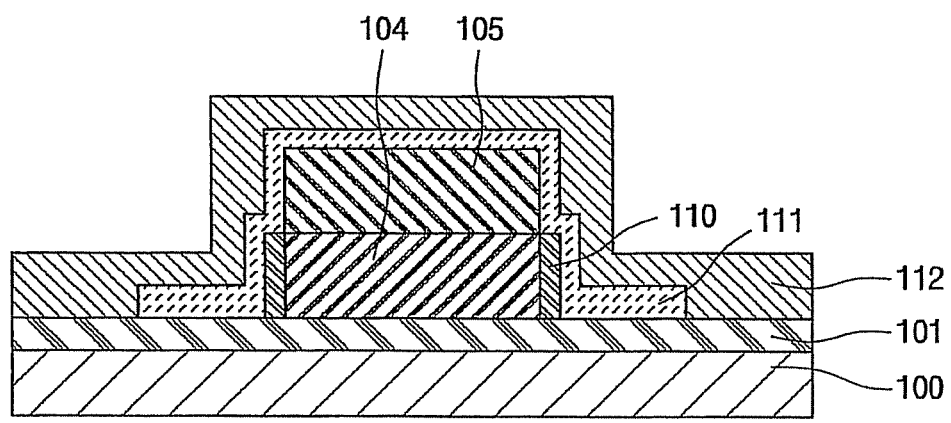

Referring to FIGS. 5A and 5B, an interlayer insulating layer 112 is formed on the entire surface of the substrate 100. The interlayer insulating layer 112 may be a silicon nitride layer, a silicon oxide layer, or a multi-layer thereof.

The interlayer insulating layer 112 and the gate insulating layer 105 are then etched to form contact holes 113, which expose the source/drain regions 107 and 108 of the semiconductor layer 104. Source/drain electrodes 114 and 115 are then connected to the source/drain regions 107 and 108, through the contact holes 113. The source/drain electrodes 114 and 115 may be formed of one of molybdenum (Mo), chromium (Cr), tungsten (W), aluminum-neodymium (Al—Nd), titanium (Ti), molybdenum tungsten (MoW), and aluminum (Al).

Exemplary Embodiment 2

Figure 6A:
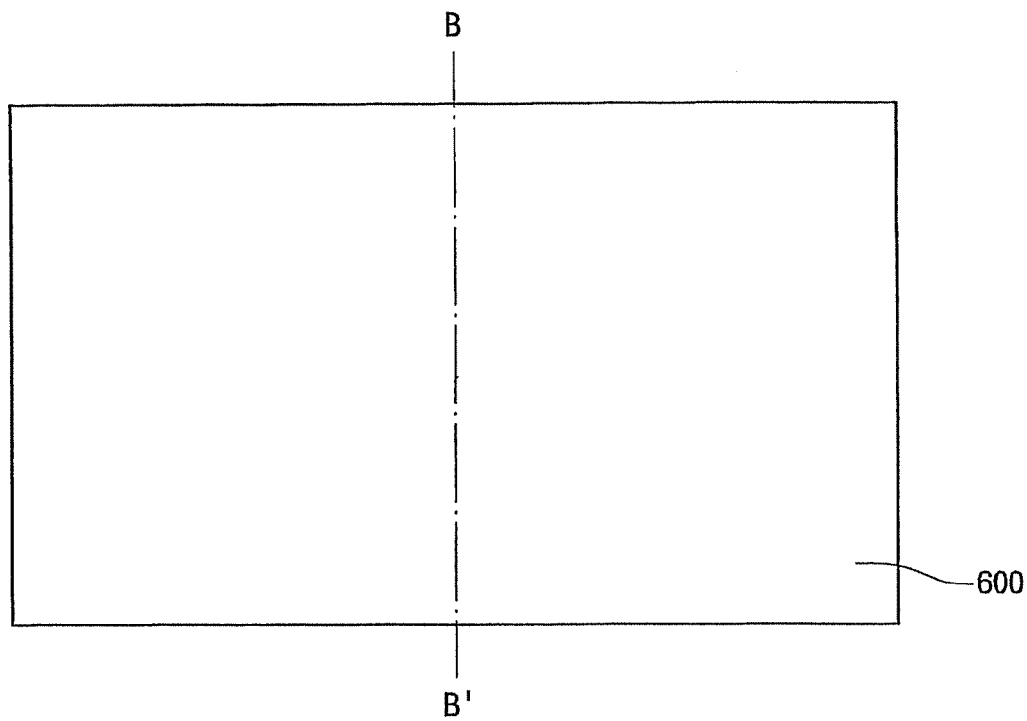
FIGS. 6A, 7A and 8A are plan views illustrating a process of fabricating a thin film transistor, according to Exemplary Embodiment 2 of the present invention.
Figure 6B:
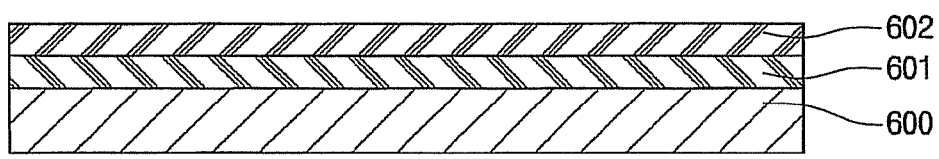
FIGS. 6B, 7B and 8B are cross-sectional views taken along line B-B' of FIGS. 6A, 7A, and 8A, respectively.
Figure 7A:
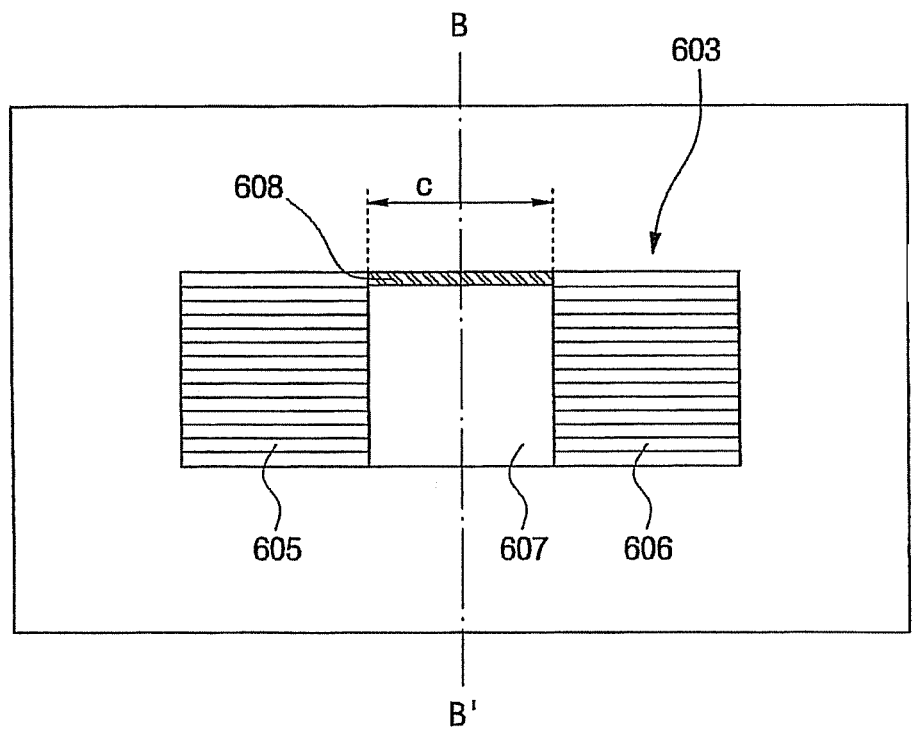
Figure 7B:
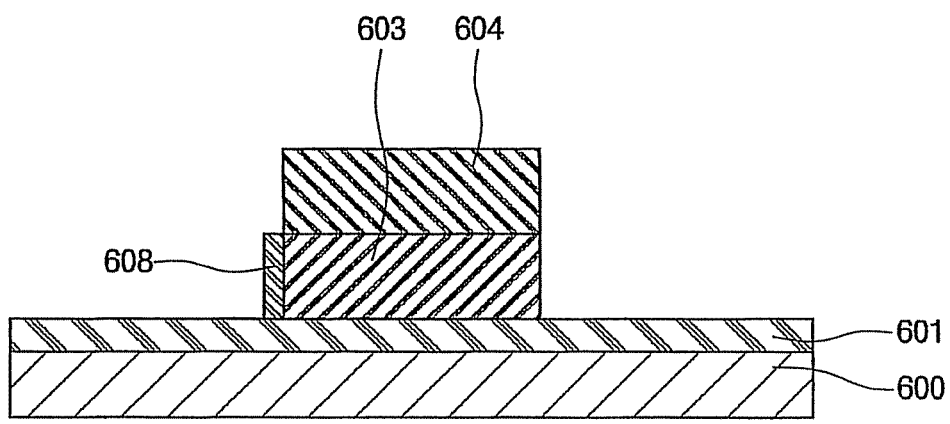
Figure 8A:
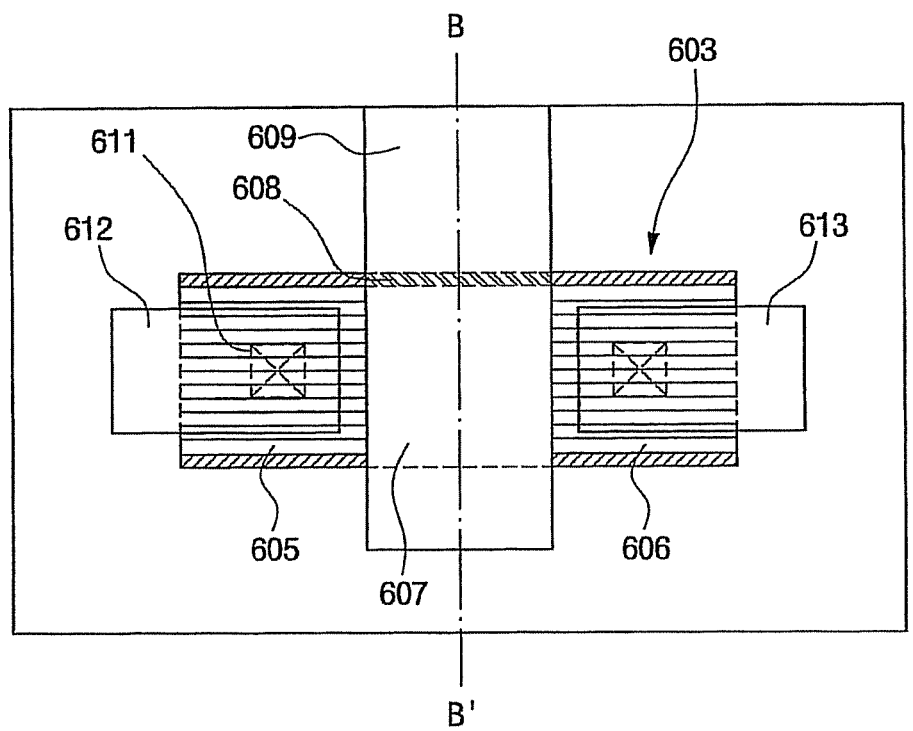
Figure 8B:
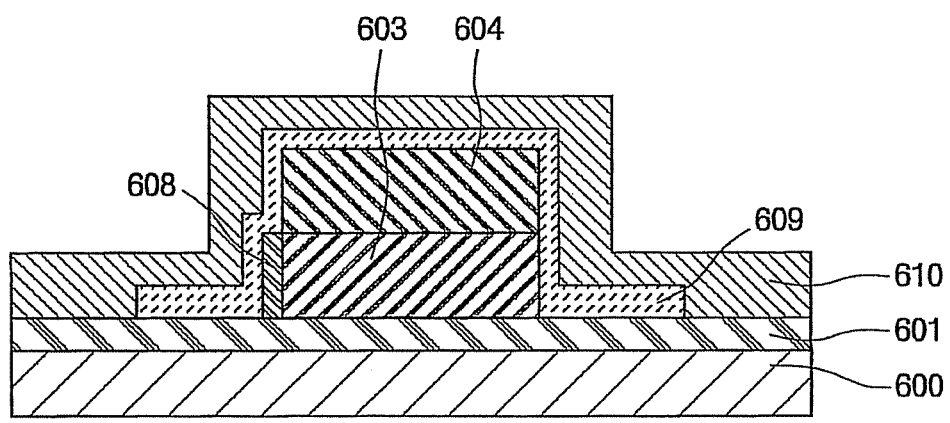

FIGS. 6A, 7A, and 8A are plan views illustrating a process of fabricating a thin film transistor, according to Exemplary Embodiment 2 of the present invention. FIGS. 6B, 7B, and 8B are cross-sectional views taken along line B-B' of FIGS. 6A, 7A, and 8A.

Referring to FIGS. 6A and 6B, a buffer layer 601 is formed on a substrate 600, and then a polycrystalline silicon layer 602 is formed on the buffer layer 601. Referring to FIGS. 7A and 7B, only the polycrystalline silicon layer 602 is patterned at first, to form a semiconductor layer 603, unlike Exemplary Embodiment 1.

An insulating layer is deposited on the entire surface of the substrate 600. The insulating layer is patterned, thereby forming a gate insulating layer 604. The patterning of the gate insulating layer 604 exposes an edge of the semiconductor layer 603, which is connected to a channel region 607 of the semiconductor layer 603.

A first impurity is then injected into the exposed edge of the semiconductor layer 603, to form a body contact region 608. A second impurity is injected into other portions of the semiconductor layer 603, to form a source region 605 and a drain region 606. The channel region 607 is an undoped portion of the semiconductor layer 603, which contacts the body contact region 608, and is disposed between the source and drain regions 605 and 606. The first and second impurities can be N-type or P-type impurities, so long as they are different types of impurities. The length c of the body contact region 608 may be equal to, or larger than, the length of the channel region 607.

Referring to FIGS. 8A and 8B, a gate electrode material is deposited on the gate insulating layer 604. The gate electrode material is then patterned to form a gate electrode 609 that overlaps the channel region 607 and the body contact region 608. The gate electrode 609 contacts the body contact region 608, through a hole formed when patterning the patterned gate insulating layer 604, resulting in a completed gate-body contact thin film transistor.

An interlayer insulating layer 610 is formed on the entire surface of the substrate. The interlayer insulating layer 610 and the gate insulating layer 604 are then etched, to form contact holes 611 that expose the source/drain regions 605 and 606 of the semiconductor layer 603. Source/drain electrodes 612 and 613 are connected to the source/drain regions 605 and 606, through the contact holes 611.

Exemplary Embodiment 3

A process of gettering a crystallization inducing metal in the semiconductor layer, using the edge of the semiconductor layer, according to Exemplary Embodiment 3 of the present invention, will now be described. A crystallization inducing metal is used to crystallize the polycrystalline silicon layer into the semiconductor layers of Exemplary Embodiments 1 and 2.

The gettering process refers to gettering the crystallization inducing metal remaining in a channel forming region into an exposed edge of a semiconductor layer, by performing an annealing process. The annealing process is performed after the impurity, and particularly an N-type impurity, is injected into the edge of the semiconductor layer.

Since the exposed edge contacts the channel region, the gettering process using the exposed edge has a high gettering efficiency, because the crystallization inducing metal present in the channel region has to move only a short distance to reach the exposed edge.

The annealing process is performed for from about 30 seconds to about 10 hours, at a temperature ranging from 450° C. to 900° C. An annealing temperature lower than about 450° C. may not sufficiently remove the crystallization inducing metal from a semiconductor layer. An annealing temperature exceeding 900° C. may deform a substrate. An annealing time of less than 30 seconds may not sufficiently remove the crystallization induced metal. An annealing time exceeding 10 hours may deform the substrate, increase fabrication costs of a TFT, and reduce yields.

Exemplary Embodiment 4

Figure 9:
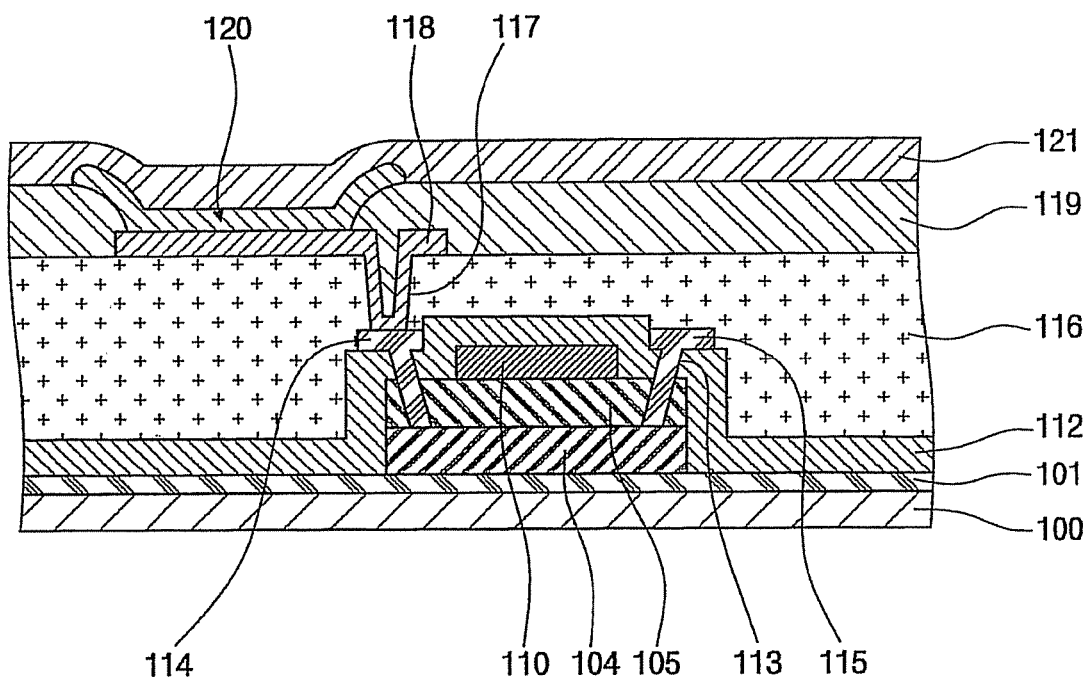
FIG. 9 is a cross-sectional view of an organic light emitting diode display device including a thin film transistor, according to an exemplary embodiment of the present invention.

FIG. 9 is a cross-sectional view of an organic light emitting diode display device including a TFT, according to an exemplary embodiment of the present invention. Referring to FIG. 9, an insulating layer 116 is formed on the entire surface of the substrate 100 including the TFT, according to the exemplary embodiment of the present invention shown in FIG. 5B. The insulating layer 116 may be formed of an inorganic layer selected from a silicon oxide layer, a silicon nitride layer, a silicon on glass layer, or an organic layer selected from polyimide, benzocyclobutene series resin, or acrylate. The insulating layer 116 may include the inorganic layer and the organic layer in a stacked formation.

The insulating layer 116 is etched to form a hole 117 that exposes one of the source and drain electrodes 114 and 115. A first electrode 118 is formed through the hole 117 and is connected to one of the source/drain electrodes 114 and 115. The first electrode 118 may an anode or a cathode. When the first electrode 118 is an anode, it may be formed of a transparent conductive material, such as indium tin oxide (ITO), indium zinc oxide (IZO), or indium tin zinc oxide (ITZO). When the first electrode 118 is a cathode, it may be formed of Mg, Ca, Al, Ag, Ba, or an alloy thereof.

A pixel definition layer 119 is then formed on the first electrode 118. The pixel definition layer 119 has an opening that exposes the surface of the first electrode 118. An organic layer 120 that includes an emission layer is formed on the first electrode 118. The organic layer 120 may further include at least one selected from the group consisting of a hole injection layer, a hole transport layer, a hole blocking layer, an electron blocking layer, an electron injection layer, and an electron transport layer. A second electrode 121 is then formed on the organic layer 120, to complete the organic light emitting diode display device.

A thin film transistor, according to aspects of the present invention, has a smaller area than a conventional gate-body contact thin film transistor, due to implementing a body contact region that does not include a separate body contact region. The body contact region is formed from an edge region of a semiconductor layer. Although a few exemplary embodiments of the present invention have been shown and described, it would be appreciated by those skilled in the art that changes may be made in these embodiments, without departing from the principles and spirit of the invention, the scope of which is defined in the claims and their equivalents.

What is claimed is:

1. A method of fabricating a thin film transistor, the method comprising:
   forming a semiconductor layer on a substrate;
   forming a gate insulating layer on the semiconductor layer, so as to expose an edge of the semiconductor layer;
   forming a gate electrode on the gate insulating layer, which contacts the exposed edge of the semiconductor layer;
   forming an interlayer insulating layer on the gate electrode; and
   forming source and drain electrodes on the interlayer insulating layer, which are respectively electrically connected to source and drain regions of the semiconductor layer.

2. The method of claim 1, wherein the exposed edge of the semiconductor layer is connected to the channel region.

3. The method of claim 2, wherein the width of the exposed edge of the semiconductor layer is not more than about 0.1 µm.

4. The method of claim 2, further comprising injecting a first type of impurity into the exposed edge of the semiconductor layer, using the gate insulating layer as a mask.

5. The method of claim 1, wherein the forming of the semiconductor layer and the gate insulating layer comprises:
   forming a polycrystalline silicon layer on the substrate;
   depositing an insulating layer on the polycrystalline silicon layer; and
   performing a one-time patterning process on the polycrystalline silicon layer and the insulating layer, to form the semiconductor layer and the gate insulating layer.

6. The method of claim 5, wherein the performing of the one-time patterning process on the polycrystalline silicon layer and the insulating layer comprises making a critical dimension (CD) bias of the insulating layer greater than a CD bias of the polycrystalline silicon layer.

7. The method of claim 1, further comprising:
   forming the semiconductor layer by crystallizing an amorphous silicon layer into a polycrystalline silicon layer, using a crystallization inducing metal;
   injecting an N-type impurity into the exposed edge of the semiconductor layer, using the gate insulating layer as a mask; and
   annealing the substrate to getter the crystallization inducing metal remaining in the semiconductor layer, into the exposed edge of the semiconductor layer.

8. The method of claim 7, wherein the annealing is performed for from about 30 seconds to about 10 hours, at a temperature of about 450° C. to about 900° C.

* * * * *